(12) United States Patent
Chen

(10) Patent No.: US 7,027,276 B2
(45) Date of Patent: Apr. 11, 2006

(54) HIGH VOLTAGE ESD PROTECTION CIRCUIT WITH LOW VOLTAGE TRANSISTORS

(75) Inventor: Chung-Hui Chen, Hsin Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 150 days.

(21) Appl. No.: 10/828,605

(22) Filed: Apr. 21, 2004

(65) Prior Publication Data

US 2005/0237681 A1    Oct. 27, 2005

(51) Int. Cl.
*H02H 9/00* (2006.01)

(52) U.S. Cl. .......................................... 361/56

(58) Field of Classification Search .................... 361/56
See application file for complete search history.

(56) References Cited

U.S. PATENT DOCUMENTS

| | | | |
|---|---|---|---|
| 2003/0133237 A1* | 7/2003 | Hung et al. | 361/56 |
| 2004/0142527 A1* | 7/2004 | Chen | 438/238 |
| 2004/0233595 A1* | 11/2004 | Ker et al. | 361/56 |

* cited by examiner

*Primary Examiner*—Ronald Leja
(74) *Attorney, Agent, or Firm*—Duane Morris LLP

(57) ABSTRACT

An ESD protection circuit includes a stacked NMOS transistor pair coupled between a pad and a negative voltage supply, with a first transistor's drain connected to the pad and a second transistor's source connected to the negative power supply. A first voltage divider provides reduced voltage from a high voltage positive power supply to a gate of the first transistor, a first diode string coupled between the gates of the first and second transistors, a second diode string with its anode coupled to the pad, an inverter with a source of its PMOS transistor coupled to a cathode of the second diode string and with its NMOS transistor coupled to the negative power supply, an output node of the inverter coupled to a gate of the second transistor, and a RC circuit coupled to an input node of the inverter, for dissipation of ESD current.

20 Claims, 4 Drawing Sheets

HIGH VOLTAGE ESD PROTECTION CIRCUIT WITH LOW VOLTAGE TRANSISTORS

BACKGROUND

The present disclosure relates generally to integrated circuit (IC) design using low voltage metal-oxide-semiconductor (MOS) transistors (MOSFETs), and more particularly, to a method for protecting the core circuitry of an integrated circuit (IC) from damage that may be caused by high voltage electrostatic discharge (ESD).

By using MOSFETs in an ESD protection circuit design, it can improve the manufacturing quality of the product. An invention that uses MOSFETs requires only the monitoring of electrical characteristics of MOS, diodes, and resistance. Most commercial MOS foundry already monitors these electrical characteristics during production. Other inventions using components such as bipolar transistors BJT, parasitic BJT of MOSFETs, and silicon-controlled rectifier SCRs require more monitoring. If an ESD circuit uses devices that the foundry does not monitor, the ESD performance cannot be controlled since the electrical characteristics of these devices may fail.

Electrostatic discharge may enter an IC through bond pads, which are connections from outside circuitry to the IC. They are usually used for supplying electric power, electric ground, and electric signals. These electrostatic discharges may be created in many different ways. For example, when parts of an external pad leading to the IC are touched by a person, he or she can create static electricity strong enough to destroy circuitry of an IC. In a MOS transistor, the gate oxide is most susceptible to damage. A voltage slightly higher than the supply voltage can destroy the gate oxide of the transistor. ESD created by common environmental sources can carry up to tens of thousands of volts when it occurs. Such voltages can damage the circuitry even though the charge and any resulting current are extremely small. To avoid these damaging voltages from building up, it is important to discharge any static electricity at the moment of occurrence. In order to protect the IC from ESD, implementation of protection circuits are necessary.

An ESD protection circuitry needs to allow the IC to operate normally while providing protection for the IC during ESD occurrences. ESD protection circuitry is typically implemented to ICs at the bond pads. The protection circuit can isolate itself from normal operation of the IC by blocking current from flowing through itself. During operation of an IC, electric power is supplied to VDD pad, and electric ground is supplied to a VSS pad. Many other pads are assigned to carry electronic signals that are supplied from outside or generated from IC. When the IC is unconnected, all pads are grounded to zero voltage.

In order for a protection circuit to work correctly, ESD will need to act as a brief power supply for one or more pads in an isolated IC, while the other pads remain floating, or grounded. Because the other pads are grounded, when ESD acts as a power supply at a randomly selected pad, the protection circuitry acts differently than it does when the IC is operating normally. When an ESD event occurs, the protection circuitry must quickly become current conductive so that the electrostatic charge is conducted to VSS ground; and, thus, dissipated before damaging voltage builds up.

With the demands of smaller size and lower power consumption on today's technology, circuitry is also shrinking in size, and using lower voltage components in order to save power. Lower voltage sources are used in internal circuits of an IC to save room, power, and money. When it comes to dealing with high voltage ESD, there is a need to solve the issue by using only low voltage components.

In the case of a high voltage ESD protection circuit, high voltage MOSFETs are usually used since low voltage MOSFETs have a thinner gate oxide which is vulnerable when high voltage is applied. The difference between low voltage and high voltage MOSFETs is the thickness of the oxide gate. With low voltage MOSFETs, the operating voltage can be lower than regular high voltage MOSFETs. Due to the thick layer of oxide gate, the high voltage oxide gate takes up more space and cost.

As such, desirable in the art of IC designs are additional designs using low voltage MOSFETs to provide the same kind of ESD protection.

SUMMARY

In view of the foregoing, this invention provides a high voltage electrostatic discharge (ESD) protection circuit using low voltage MOSFETs, and the method for operating the same.

In one example, an ESD protection circuit is disclosed, including a stacked NMOS transistor pair coupled between a pad and a negative voltage supply, with a first transistor's drain connected to the pad, and a second transistor's source connected to the negative power supply. It further includes a first voltage divider providing reduced voltage from a high voltage positive power supply to a gate of the first transistor; a first diode string coupled between the gates of the first and second transistors; a second diode string with its anode end coupled to the pad; an inverter with a source of a PMOS transistor thereof coupled to a cathode end of the second diode string, and with its NMOS transistor coupled to the negative power supply, an output node of the inverter being coupled to a gate of the second transistor, and a RC circuit coupled to an input node of the inverter, wherein an ESD current travels through the stacked NMOS transistor pair for dissipation. The ESD protection circuit dissipates high voltage electrostatic discharge by using low voltage MOSFETs, thereby saving design space and cost.

The construction and method of operation of the protection circuit, however, together with additional objects and advantages thereof, will be best understood from the following description of specific embodiments when read in connection with the accompanying drawings.

DESCRIPTION

The present invention provides a circuit and method for high voltage electrostatic discharge protection using low voltage MOSFETs. It is also important to find a solution to provide electrostatic discharge (ESD) protection on high voltage applications with low voltage transistors (e.g., thin oxide transistors). It is understood that a high voltage power supply can be anywhere between 5V to 15V in the current applications, and the ESD voltages incurred in high voltage application circuits can be between 8 kV to 100V.

Figure 1A:
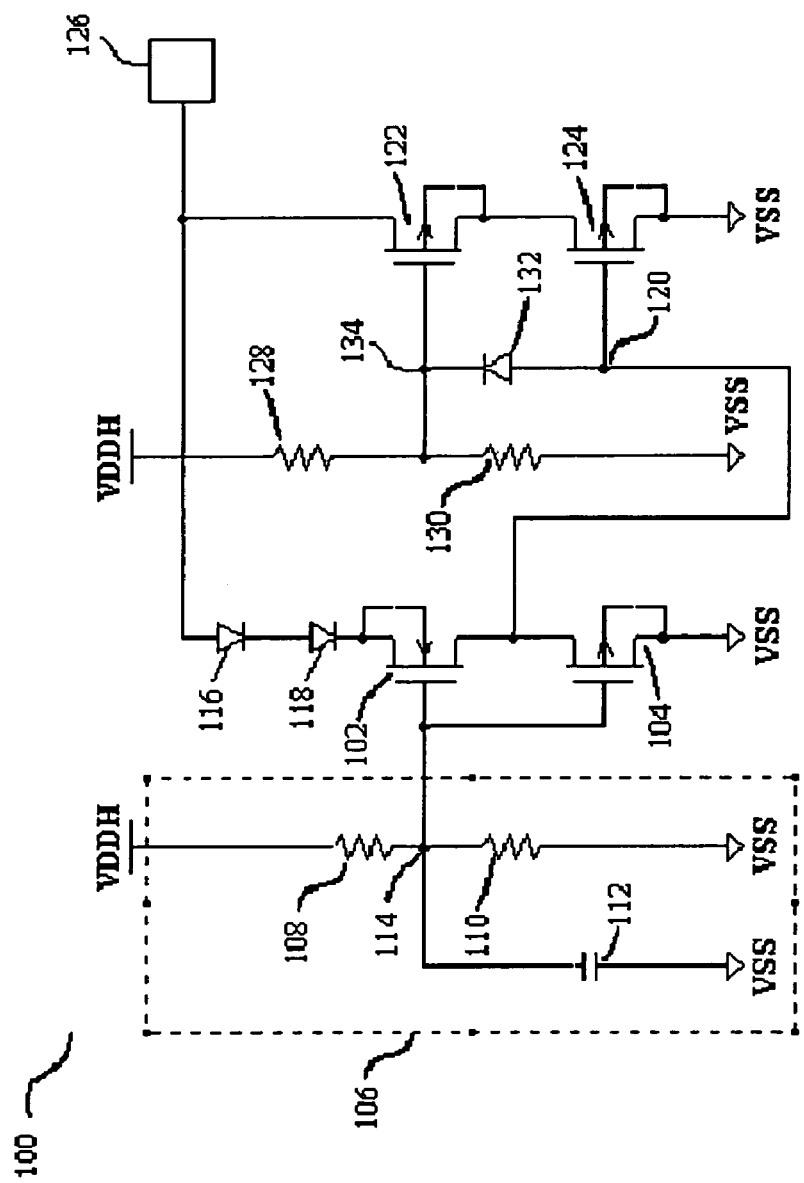
FIG. 1A illustrates a high voltage electrostatic discharge protection circuit in accordance with one embodiment of the present invention.

FIG. 1A illustrates one embodiment of this invention showing a high voltage ESD protection circuit 100 connected to the bond pad of an integrated circuit (IC). In this example, an external positive power supply VDDH is used for supplying power. Another negative power supply, VSS, will provide an electric ground. VSS is shown to be supplied internally to five locations.

This protection circuit may provide ESD protection for other IC circuitries. However, when the IC is in operation, the protection circuit 100 is designed to avoid causing any effect on the operation while still providing ESD protection for the IC circuitries. Until ESD occurs, the protection circuit needs to isolate itself from the other IC circuitries.

During normal operation of the IC, PMOS 102 and NMOS 104 are off and on, respectively, such that the protection circuit 100, by blocking current from flowing therethrough, has no influence on other IC circuitries. The mechanism controlling the switch between normal operation and ESD occurrence is provided by an RC circuit 106, which is implemented to adjust the gate voltage of the PMOS 102 and NMOS 104. The PMOS and NMOS transistors 102 and 104 are effectively an inverter. The RC circuit 106 includes resistors 108 and 110, and a capacitor 112. The resistors 108 and 110 are set up in a voltage divider configuration. The resistors working with the capacitor 112 charge up the voltage at a node 114 of the RC circuit 106 slowly over time if VDDH provides power over a certain period of time. During IC operation, VDDH is expected to provide constant power, thereby allowing the capacitor 112 to charge up and give a higher voltage to the node 114. As shown in the protection circuit 100, the node 114 is connected directly to the gates or input node of the inverter comprised of PMOS 102 and NMOS 104. As is also shown, the source of PMOS 102 is protected by a diode string having two protection diodes 116 and 118. The diode string, which is in a series with its anode end coupled to the pad, drops the voltage going into the source of the PMOS 102 since PMOS transistors are much more sensitive to high voltage compared to NMOS transistors. It is understood that if the voltage on DDH or PAD is lower or equal to the voltage that the MOS device can stand, diodes 116 and 118 may be optional. Eventually, the voltage at the node 114 may be charged to a higher potential than the output node of the inverter 120, thereby causing the PMOS 102 to turn off and further stop current from flowing thereacross. While the PMOS 102 is turned off, the NMOS 104 is turned on due to a higher gate voltage. When the NMOS 104 is on, a node 120 may be pulled down to VSS, or electric ground, thereby turning off NMOSs 122 and 124 for avoiding any current leakage. When both NMOSs 122 and NMOS 124 are off, the IC circuit may not be affected by the protection circuit during operation.

When ESD occurs, the charge may enter the protection circuit 100 through a pad 126. In order to dissipate the charge to VSS to avoid damage, NMOSs 122 and 124 need to be turned on. The NMOS 122 is already slightly turned on since it is biased slightly below the active region through voltage division by two resistors 128 and 130. This bias is designed in such a way that it may reduce the time needed to turn on a transistor at the beginning of an ESD event. Initially, due to the RC delay, voltage at node 114 is still lower than that of node 120, thereby keeping the PMOS 102 on. The voltage of an electrostatic discharge is extremely high, and it is high enough where even after passing through the protection diodes 116 and 118, it may still remain high at the source of PMOS 102. The ESD charge will pass through the PMOS 102, and the voltage at node 120 is raised. In turn, the NMOS transistor 124 may be turned on due to the high voltage at the node 120. When the voltage at the node 120 keeps rising and surpasses a predetermined value determined by the voltage divider, the voltage at node 134 is also raised. A forward bias diode string 132 (e.g., in this case only one diode is used) draws current from node 120 to node 134 to completely turn the NMOS 122 on, thereby speeding up the dissipation of ESD charge.

It should be noted that in a high voltage application, transistors bearing the stress caused by the high voltage supply are normally thick oxide devices. To use thin oxide devices replacing these thick oxide devices can reduce the cost and power consumption significantly. In the above described design, none of the transistors is coupled to a high voltage such as VDDH. Instead, the stacked, thin oxide transistors 122 and 124 are coupled between a pad and VSS to provide ESD protection. In order to avoid imposing high voltage on thin oxide transistors, voltage dividers such as resistor combinations 108 and 110, or 128 and 130, are used to reduce VDDH down to an acceptable level.

Figure 1B:
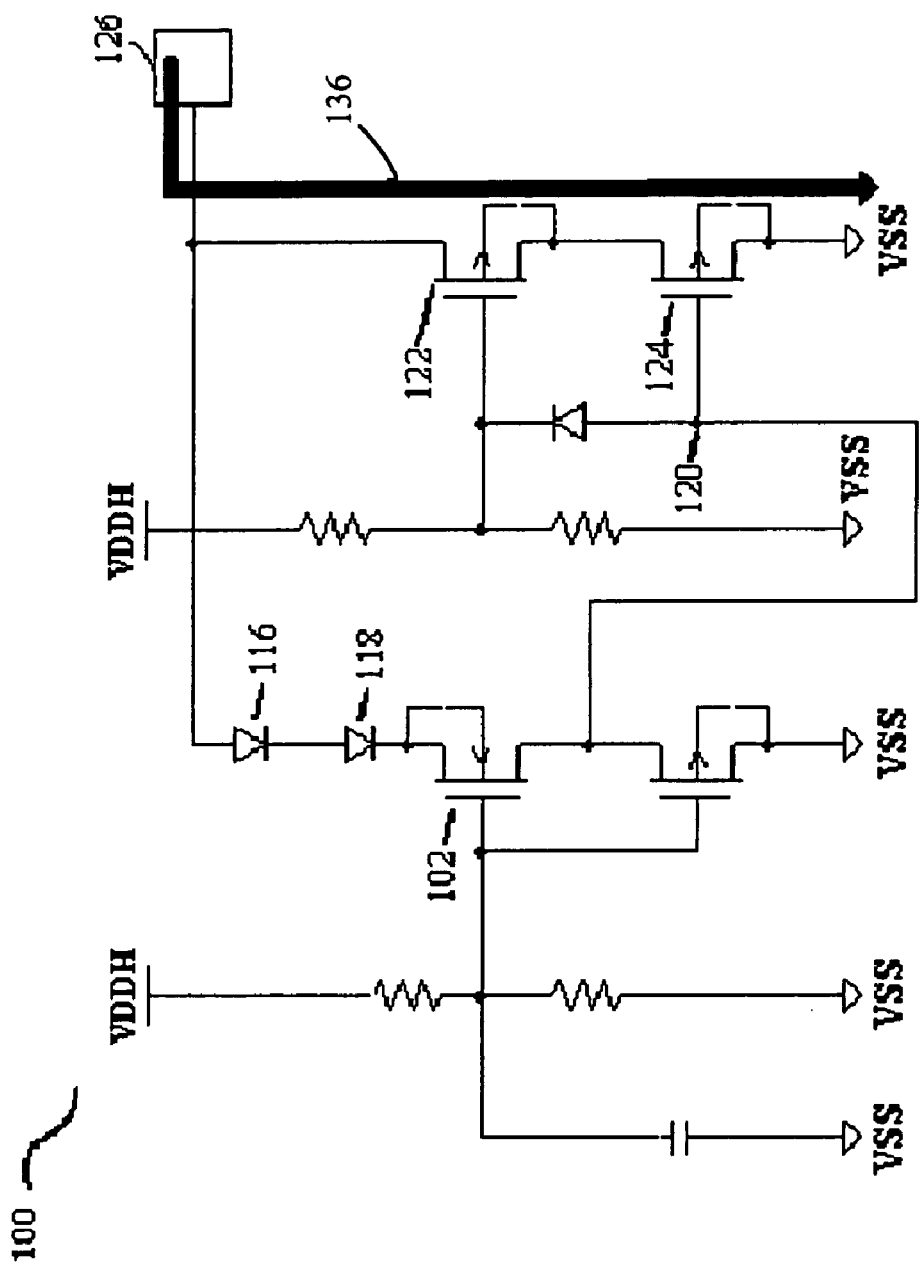
FIG. 1B illustrates a current pathway during a positive electrostatic discharge event in accordance with one embodiment of the present invention.

FIG. 1B illustrates a current pathway 136 during a positive electrostatic discharge event inside the protection circuit 100. When ESD arrives at the pad 126, the ESD acts as a power supply applying voltage to the pad 126. The protection circuit 100 reacts as previously explained. The high voltage, created when ESD strikes, may turn PMOS 102 on after passing through the protection diodes 116 and 118, thereby bringing the node 120 to a high voltage. Both stacked low voltage NMOSs 122 and 124 turn on, thereby providing a straight current path to VSS from the pad 126, as illustrated by the current pathway 136. This allows the ESD current to flow straight into the ground through the NMOSs 122 and 124, thereby avoiding any damage to the circuitries that the protection circuit is designed to protect.

Figure 2:
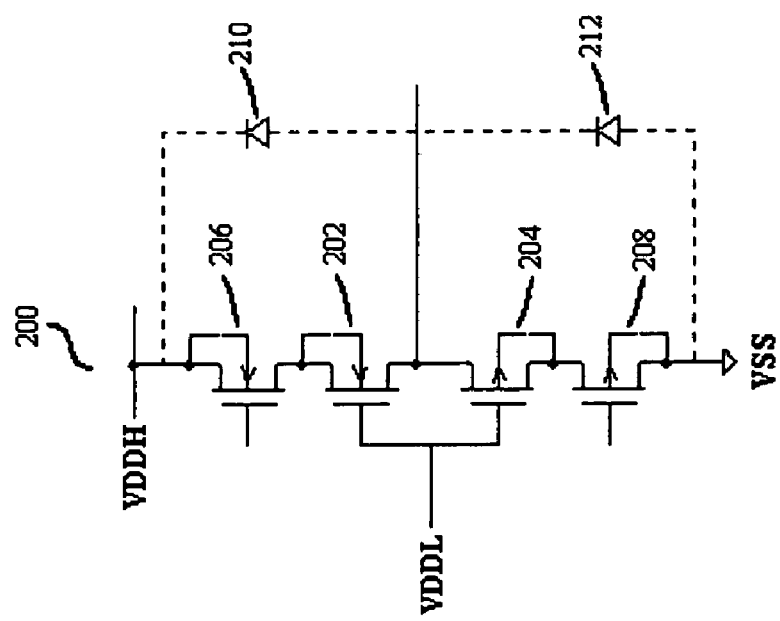
FIG. 2 illustrates a high voltage output driver circuit.

FIG. 2 illustrates a high voltage output driver circuit 200 consisting of two low voltage PMOSs and two low voltage NMOSs. The output driver circuit 200 is an example of an interface circuit that may be protected by the protection circuit 100. Details of how it is interfaced with the protection circuit will be discussed in FIG. 3. The output driver circuit 200 allows internal low voltage VDDL to be translated into high voltage VDDH by using low voltage MOSFETs. A typical high voltage output driver circuit 200 would only consist of a high voltage PMOS and a high voltage NMOS connected in series, but in FIG. 2, the same result may be achieved by using low voltage MOSFETs alone. Two extra low voltage MOSFETs 202 and 204 would need to be added at the output of the circuit as shown in the circuit 200. Due to the thinner gate oxide of low voltage MOSFETs, these two MOSFETs are needed to avoid overstressing the transistors 206 and 208. PMOS 202 and NMOS 204 are implemented with both gates biased as low voltage source VDDL. Both stacked PMOSs 202 and 206 and stacked NMOSs 204 and 208 have substrate back gate diodes 210 and 212 connected to them, respectively. The diodes 210 and 212 may provide a path for ESD as will be illustrated in the next FIG. 3. The circuit 200 shows how this invention may be more valuable to a high voltage application that only utilizes low voltage MOSFETs.

Figure 3:
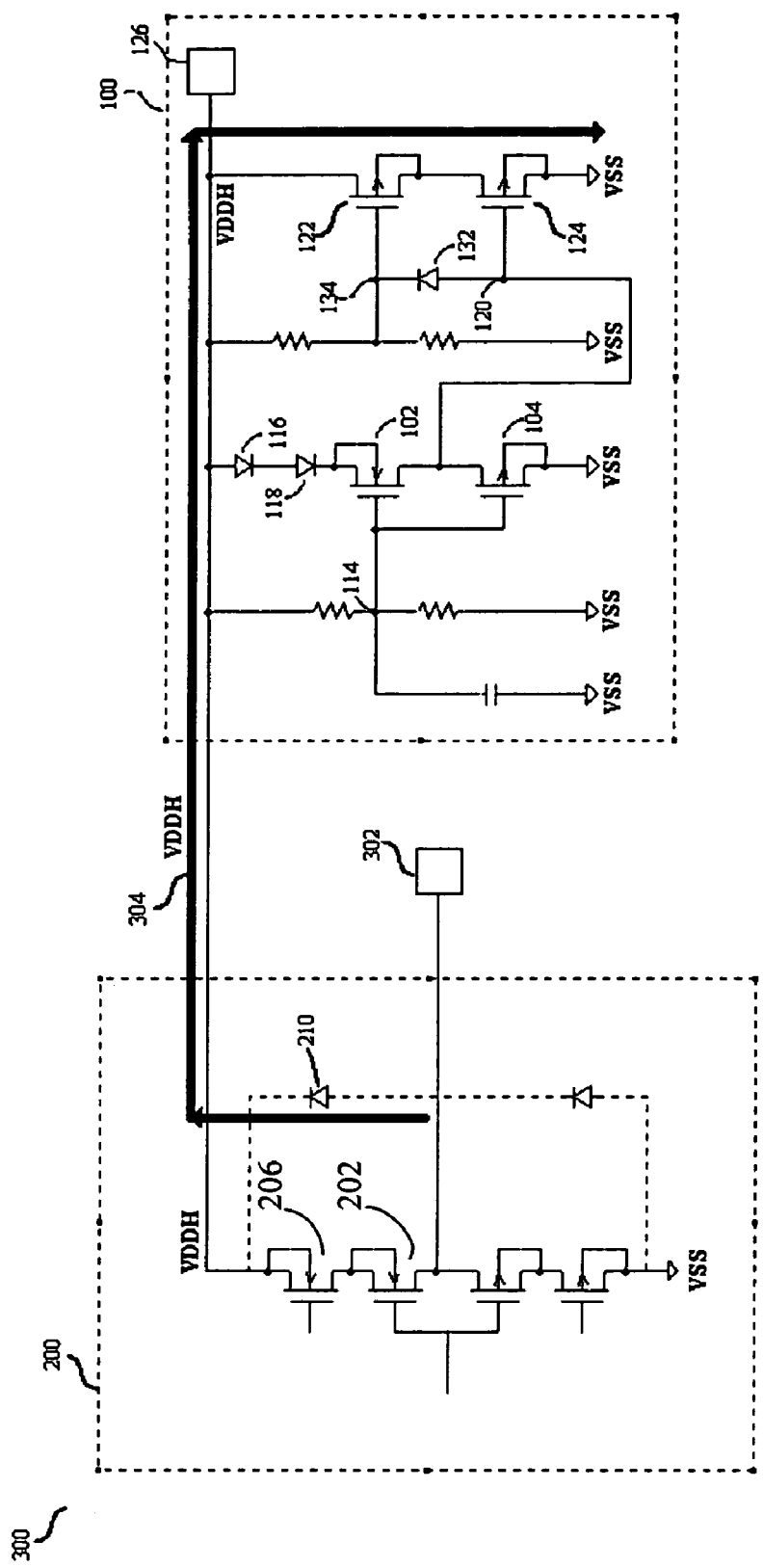
FIG. 3 illustrates a current pathway through VDDH during an ESD event in accordance with one embodiment of the present invention.

FIG. 3 presents a diagram 300 that includes the protection circuit 100, the output driver circuit 200, a pad 302 and a current pathway 304, along which ESD charge is dissipated, through VDDH connection to both the protection circuit 100 and the output driver circuit 200, during an ESD event, in accordance with one embodiment of the present invention. This example shows how the output driver circuit 200 is interfaced with the protection circuit allowing the protection circuit to dissipate any ESD occurring at the bond pad 302 of the output driver circuit 200. ESD may occur at any pad that is connected to external pads. Protection circuit is needed to protect other circuitry such as the output driver circuit 200. If there is no ESD protection, the MOSFETs of the output driver circuit 200 may be destroyed by ESD. In the diagram 300, the protection circuit 100 is utilized to protect the output driver circuit 200 from ESD.

In this example, the pad 126 is a VDDH pin such that the circuits 100 and 200 share the connection through VDDH, and this connection also provides a path for ESD charges when ESD strikes. As ESD transient develops a high peak voltage at the pad 302, the substrate back gate diode 210 of the PMOSs 202 and 206 may provide a path from the pad 302 through VDDH, thereby allowing the ESD charge to travel to VDDH before damaging the output driver circuit 200. From this point, a same series of effect takes place as previously explained. The high voltage of ESD passes through the protection diodes 116 and 118, and turns the PMOS 102 on. This provides a high voltage at the node 120, thereby turning NMOS 124 on. The forward bias diode 132 increases the voltage at the node 134, thereby ensuring that the NMOS 122 is completely turned on. With both NMOSs 122 and 124 completely on, the current pathway 304 dissipates ESD to VSS before damaging voltage build up. As the ESD charges are grounded, the output driver circuit 200 is protected.

If the output driver circuit 200 is in operation, the protection circuit 100 isolates itself from the output driver 200 unless ESD occurs. As explained in FIG. 1A, the voltage at the node 114 is high during the operation mode, thereby turning NMOS 104 on and grounding the voltage at the node 120. As a result, the NMOS 124 is turned off, thereby allowing normal operation of the output driver circuit 200 without any interference from the ESD protection circuit.

As can be seen above, the ESD protection circuit disclosed herein works with a high voltage supply VDDH, but needs no high voltage devices in the circuit. The operating voltage of the transistors involved can be much lower than VDDH so that a significant power saving is achieved. Further, as technology advances, thinner and thinner gate oxide transistors can be produced, and the two thin oxide transistors 122 and 124 of FIG. 1 can increase their channel current so that larger current can be sunk through them. In addition, in a manufacturing facility where device electrical characteristics are monitored for predicting the performance, this invention only requires the monitoring of regular MOSFET, diodes, and resistors as it is always done on a regular basis, and no other devices such as bipolar transistors, parasitic bipolar transistors, or rectifiers are in need of monitoring. In summary, the present invention provides a CMOS compatible ESD protection mechanism for protecting high voltage circuits with low voltage transistors.

The above invention provides many different embodiments or embodiments for implementing different features of the invention. Specific embodiments of components and processes are described to help clarify the invention. These are, of course, merely examples and are not intended to limit the invention from that described in the claims.

Although the invention is illustrated and described herein as embodied in a design and method for providing an ESD protection mechanism, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrostatic discharge (ESD) protection circuit comprising:
   a stacked NMOS transistor pair coupled between a pad and a negative voltage supply with a first transistor's drain connected to the pad and a second transistor's source connected to the negative power supply;
   a first voltage divider providing reduced voltage from a high voltage positive power supply to a gate of the first transistor;
   a first diode string coupled between the gates of the first and second transistors;
   a second diode string with its anode end coupled to the pad;
   an inverter with a source of a PMOS transistor thereof, coupled to a cathode end of the second diode string and with its NMOS transistor coupled to the negative power supply, along with an output node of the inverter being coupled to a gate of the second transistor; and
   a RC circuit coupled to an input node of the inverter,
   wherein an ESD current travels through the stacked NMOS transistor pair for dissipation.

2. The circuit of claim 1 wherein the protection circuit is coupled to at least one pad that is connected to a high voltage positive power supply.

3. The circuit of claim 1 wherein all the transistors are low voltage transistors.

4. The circuit of claim 1 wherein the RC circuit, the second diode string, and the first voltage divider collectively turn on the first and second transistors in the stacked NMOS transistor pair while dissipating the ESD current.

5. The circuit of claim 1 further comprising a high voltage output driver circuit coupled thereto, wherein the ESD current initiated on an output pad of the driver circuit discharges through the stacked NMOS transistor pair.

6. The circuit of claim 5 wherein the high voltage output driver circuit uses low voltage transistors.

7. The circuit of claim 6 wherein the high voltage output driver circuit has at least two PMOS transistors and two NMOS transistors coupled in series respectively wherein a gate voltage of two transistors is adjusted so that a stress caused by the high voltage positive power supply is reduced on each transistor.

8. An electrostatic discharge (ESD) protection circuit having only low voltage transistors, the circuit comprising:
   a stacked NMOS transistor pair coupled between a pad and a negative voltage supply with a first transistor's drain connected to the pad and a second transistor's source connected to the negative power supply;
   a first voltage divider providing a reduced voltage from a high voltage positive power supply to a gate of the first transistor;
   a first diode string coupled between the gates of the first and second transistors;
   an inverter with a source of a PMOS transistor thereof coupled to the pad and with its NMOS transistor coupled to the negative power supply, along with an output node of the inverter being coupled to a gate of the second transistor; and a RC circuit coupled to an input node of the inverter, wherein an ESD current travels through the stacked NMOS transistor pair for dissipation.

9. The circuit of claim 8 further comprising a second diode string with its anode end coupled to the pad, and its cathode end coupled to the inverter.

10. The circuit of claim 8 wherein the protection circuit is coupled to at least one pad that is connected to a high voltage positive power supply.

11. The circuit of claim 8 wherein the RC circuit, and the first voltage divider, collectively, turn on the first and second transistors in the stacked NMOS transistor pair while dissipating the ESD current.

12. The circuit of claim 8 further comprising a high voltage output driver circuit coupled thereto, wherein the ESD current initiated on an output pad of the driver circuit discharges through the stacked NMOS transistor pair.

13. The circuit of claim 12 wherein the high voltage output driver circuit uses low voltage transistors.

14. The circuit of claim 8 wherein the RC circuit has predetermined resistance and capacitance to assure that the inverter's output node stays high initially when the ESD current starts.

15. A circuit with high voltage power supply integrated with an electrostatic discharge (ESD) protection mechanism using low voltage transistors, the circuit comprising:
   an ESD protection circuit using only low voltage transistors, the ESD protection circuit further comprising:
      a stacked NMOS transistor pair coupled between a pad and a negative voltage supply with a first transistor's drain connected to the pad and a second transistor's source connected to the negative power supply;
      a first voltage divider providing a reduced voltage from a high voltage positive power supply to a gate of the first transistor;
      a first diode string coupled between the gates of the first and second transistors;
      a second diode string with its anode end coupled to the pad;
      an inverter with a source of a PMOS transistor thereof coupled to a cathode end of the second diode string and with its NMOS transistor coupled to the negative power supply, along with an output node of the inverter being coupled to a gate of the second transistor; and
      a RC circuit coupled to an input node of the inverter; and
   an application circuit using the high voltage power supply as its operation voltage;
   wherein an ESD current initiated from the application circuit travels through the stacked NMOS transistor pair of the ESD protection circuit for dissipation.

16. The circuit of claim 15 wherein the ESD protection circuit is coupled with the application circuit through a high voltage power supply node.

17. The circuit of claim 15 wherein the RC circuit, the second diode string, and the first voltage divider, collectively, turn on the first and second transistors in the stacked NMOS transistor pair while dissipating the ESD current.

18. The circuit of claim 15 wherein the application circuit is a high voltage output driver circuit, wherein the ESD current initiated on an output pad of the driver circuit discharges through the stacked NMOS transistor pair.

19. The circuit of claim 18 wherein the high voltage output driver circuit uses low voltage transistors.

20. The circuit of claim 19 wherein the high voltage output driver circuit has at least two PMOS transistors and two NMOS transistors coupled in series, respectively, wherein a gate voltage of two transistors is adjusted so that stress caused by the high voltage positive power supply is reduced on each transistor.

* * * * *